US012777912B2

(12) United States Patent
Choi et al.

(10) Patent No.: US 12,777,912 B2
(45) Date of Patent: Oct. 27, 2026

(54) DOUBLE-DECKED INTERCONNECT FEATURES

(71) Applicant: Intel Corporation, Santa Clara, CA (US)

(72) Inventors: June Choi, Portland, OR (US); Richard Schenker, Portland, OR (US); Charles H. Wallace, Portland, OR (US); Nikhil J. Mehta, Portland, OR (US); Clifford L. Ong, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 196 days.

(21) Appl. No.: 17/894,380

(22) Filed: Aug. 24, 2022

(65) Prior Publication Data

US 2024/0071913 A1 Feb. 29, 2024

(51) Int. Cl.
*H10W 20/43* (2026.01)
*H10W 20/42* (2026.01)
(Continued)

(52) U.S. Cl.
CPC .......... *H10W 20/43* (2026.01); *H10W 20/42* (2026.01); *H10W 20/4403* (2026.01); *H10W 20/48* (2026.01)

(58) Field of Classification Search
CPC ..... H10B 10/18; H10B 10/12; H01L 23/5283; H01L 21/76849; H01L 21/76895;
(Continued)

(56) References Cited

U.S. PATENT DOCUMENTS

2006/0180930 A1* 8/2006 Nguyen .............. H01L 23/5283 257/E23.152
2007/0020829 A1* 1/2007 Hotta ............... H01L 21/76832 257/E23.15

(Continued)

OTHER PUBLICATIONS

Extended European Search Report received for EP Application No. 23185495.1, dated Feb. 13, 2024. 7 pages.

(Continued)

*Primary Examiner* — Galina G Yushina
(74) *Attorney, Agent, or Firm* — Arcane Law PLLC

(57) ABSTRACT

An integrated circuit structure includes a first interconnect layer, and a second interconnect layer above the first interconnect layer. The first interconnect layer includes a first interconnect feature and a second interconnect feature. The second interconnect layer includes a third interconnect feature, a fourth interconnect feature, and a fifth interconnection feature. The third interconnect feature extends from an upper surface of the first interconnect feature to an upper surface of the second interconnect layer. In an example, the fourth interconnect feature extends from an upper surface of the second interconnect feature to below the upper surface of the second interconnect layer, and the fifth interconnect feature extends from an upper surface of the fourth interconnect feature to the upper surface of the second interconnect layer. Thus, a double-decked vertical stack of interconnect features is formed using the fourth interconnect feature within the second interconnect layer.

20 Claims, 10 Drawing Sheets

(51) Int. Cl.
*H10W 20/44* (2026.01)
*H10W 20/48* (2026.01)

(58) Field of Classification Search
CPC ............. H01L 21/75895; H01L 23/528; H01L 23/5226; H01L 23/53209; H01L 23/5329; H01L 21/76816; H10W 20/43; H10W 20/42; H10W 20/4403; H10W 20/48; H10W 20/0698; H10W 20/037; H10W 20/089; H10W 20/435
See application file for complete search history.

(56) References Cited

U.S. PATENT DOCUMENTS

| | | | | |
|---|---|---|---|---|
| 2010/0219534 | A1* | 9/2010 | Seidel | H01L 21/76837 257/E21.24 |
| 2015/0364371 | A1* | 12/2015 | Yen | H01L 21/7685 438/666 |
| 2020/0006639 | A1 | 1/2020 | Wu et al. | |
| 2020/0098685 | A1* | 3/2020 | Lee | H01L 23/5226 |
| 2020/0098688 | A1 | 3/2020 | Shi et al. | |
| 2021/0335720 | A1 | 10/2021 | Liang et al. | |
| 2021/0343588 | A1* | 11/2021 | Lin | H01L 23/53238 |
| 2021/0391255 | A1* | 12/2021 | Chen | H01L 21/76802 |
| 2022/0238439 | A1 | 7/2022 | Hong et al. | |
| 2023/0154792 | A1* | 5/2023 | Chin | H01L 21/76849 257/751 |

OTHER PUBLICATIONS

Communication pursuant to Article 94(3) EPC for EP application No. 23185495.1, dated Sep. 5, 2025. 8 pages.

* cited by examiner

DOUBLE-DECKED INTERCONNECT FEATURES

FIELD OF THE DISCLOSURE

The present disclosure relates to integrated circuits, and more particularly, to interconnect features.

BACKGROUND

Memory of an integrated circuit is sometimes embedded within the interconnect structure of the integrated circuit. Example such memories include dynamic random access memory (DRAM) and static random access memory (SRAM), both of which can persistently store data while power is applied. While such memories can be configured differently (e.g., DRAM cells may be implemented with a transistor and capacitor and rely on refresh circuitry, while SRAM cells include six transistors and need no refresh circuit), they include the use of word lines and bit lines. For example, in one configuration, each SRAM bit cell consists of six transistors (a 6T configuration). In such a 6T configuration, four of the transistors are arranged to form a bistable latch. The bistable latch is capable of assuming one of two stable states—either a high-resistance state which may be representative of an 'off' or '0' state, or a low-resistance state which may be representative of an 'on' or '1' state. Each of these states corresponds to a logic value (0 or 1) of the bit of data stored in the SRAM bit cell. Further, the remaining two transistors are coupled to the latch to provide switchable access to the latch as may be used during read and write operations involving the SRAM bit cell. These access transistors are coupled to a word line and two bit lines. The word line controls the access transistors, causing them to couple the bit lines to the latch during read and write operations and to decouple the bit lines from the latch at other times. During a read or write operation involving SRAM, the bit lines are pre-charged to a state appropriate to implement the read or write operation, and the word line is activated (i.e., pulsed) to couple the latch to the bit lines for a duration of time. During a read operation, when the word line is activated the bit lines discharge to a voltage proportional to the state of the latch. A sense amplifier coupled to the bit lines detects the change in voltage on the bit lines and amplifies the change to a data signal having a value of 0 or 1. This data signal is stored in a buffer and/or provided to an output bus.

There remain a number of non-trivial issues with respect to interconnect structures having memory embedded therein.

Figure 1A:
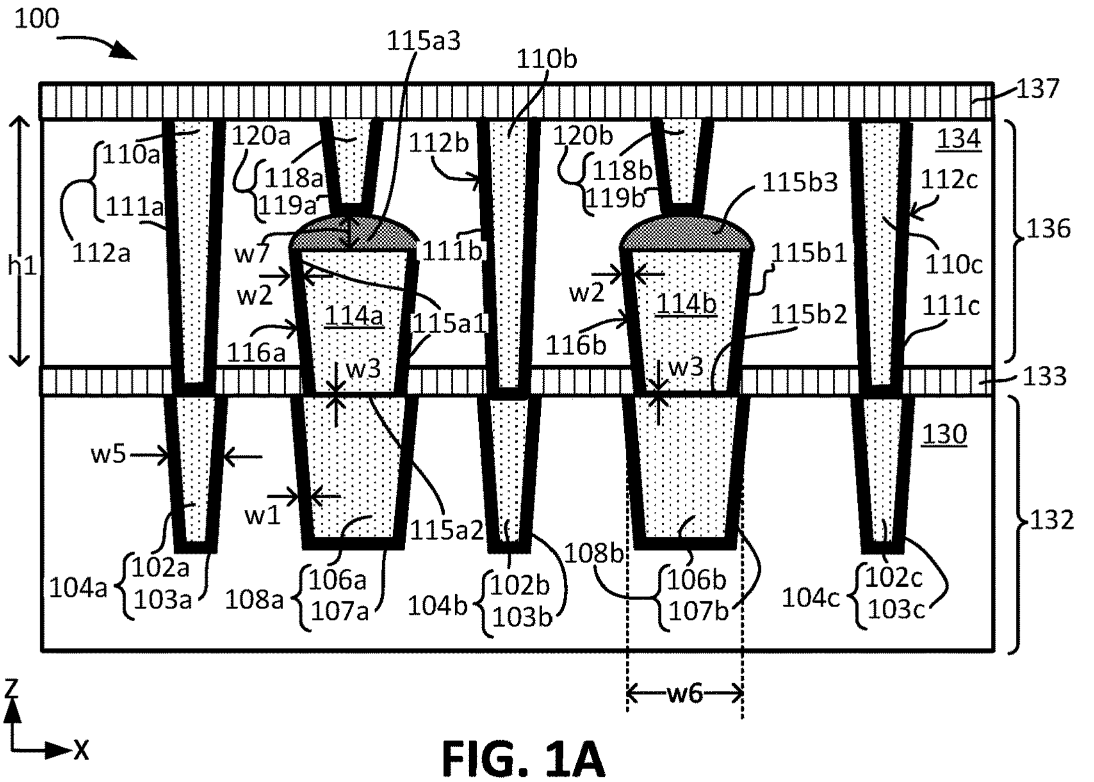
FIGS. 1A and 1C illustrate views of an integrated circuit structure comprising (i) a lower interconnect layer including a first interconnect feature and a second interconnect feature, and (ii) an upper interconnect layer above the lower interconnect layer, the upper interconnect layer including a third interconnect feature, a fourth interconnect feature, and a fifth interconnection feature, wherein the third interconnect feature extends from an upper surface of the first interconnect feature to an upper surface of the upper interconnect layer, wherein the fourth interconnect feature extends from an upper surface of the second interconnect feature to below the upper surface of the upper interconnect layer, and wherein the fifth interconnect feature extends from an upper surface of the fourth interconnect feature to the upper surface of the upper interconnect layer, in accordance with an embodiment of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used. Likewise, while the thickness of a given first layer may appear to be similar in thickness to a second layer, in actuality that first layer may be much thinner or thicker than the second layer; same goes for other layer or feature dimensions.

DETAILED DESCRIPTION

Techniques are provided herein to form an integrated circuit comprising a double-decked vertical stack of interconnect features. For example, the double-decked vertical stack of interconnect features comprises a lower interconnect feature and an upper interconnect feature, where the lower and upper interconnect features extend within a single interconnect layer. In an example, the lower and upper interconnect features extend between a lower etch stop layer and an upper etch stop layer. In an example, the lower interconnect feature is made relatively wider, e.g., to reduce ohmic resistance of the stack. In contrast, another relatively narrow (e.g., narrower than the lower interconnect feature) laterally adjacent single interconnect feature (e.g., laterally adjacent to the stack) extends through the interconnect layer, and extends between the lower etch stop layer and the upper etch stop layer. The single interconnect feature may be made narrower, e.g., which increases its ohmic resistance, but reduces the capacitance. The relatively narrow single interconnect feature may be used for transmission of logic signals (such as for word lines and/or VCC of a memory cell) that can withstand relatively high ohmic resistance but that prefer lower capacitance. On the other hand, the vertical stack of the lower and upper interconnect features (with at least the lower interconnect feature being relatively wide)

may be used for power and/or analog signals (such as for bit lines and/or bit line bar signals of a memory cell) that prefer lower resistance.

In one embodiment, an integrated circuit structure comprises a first interconnect layer, and a second interconnect layer above the first interconnect layer. The first interconnect layer includes a first interconnect feature and a second interconnect feature. The second interconnect layer includes a third interconnect feature, a fourth interconnect feature, and a fifth interconnection feature. The third interconnect feature extends from an upper surface of the first interconnect feature to an upper surface of the second interconnect layer. In an example, the fourth interconnect feature extends from an upper surface of the second interconnect feature to below the upper surface of the second interconnect layer, and the fifth interconnect feature extends from an upper surface of the fourth interconnect feature to the upper surface of the second interconnect layer. Thus, a double-decked vertical stack of interconnect features is formed using the fourth and fifth interconnect features within the second interconnect layer.

In another embodiment, an integrated circuit structure comprises an upper etch stop layer, and a lower etch stop layer below the upper etch stop layer. The upper and lower etch stop layers effectively define the top and bottom surfaces of one interconnect layer of an overall interconnect structure including one or more additional interconnect layers. Each of the upper and lower etch stop layer comprises corresponding dielectric materials. In an example, a first interconnect feature extends from the lower etch stop layer to the upper etch stop layer. In an example, a vertical stack of a second interconnect feature and a third interconnect feature extends from the lower etch stop layer to the upper etch stop layer. For example, the second interconnect feature extends from the lower etch stop layer, the third interconnect feature extends from the upper etch stop layer, and an upper surface of the second interconnect feature and a lower surface of the third interconnect feature makes contact at a plane between the upper and lower etch stop layers.

In yet another embodiment, an integrated circuit structure comprises a vertical stack of a lower interconnect feature, an intermediate interconnect feature, and an upper interconnect feature. For example, in the vertical stack, a lower surface of the intermediate interconnect feature is on an upper surface of the lower interconnect feature, and a lower surface of the upper interconnect feature is on an upper surface of the intermediate interconnect feature. In an example, the intermediate interconnect feature comprises (i) conductive fill material, (ii) a first section of a layer comprising conductive material on side surfaces of the conductive fill material, and (iii) a second section of the layer comprising conductive material on a bottom surface of the conductive fill material. In an example, a thickness of the first section of the layer is at least 0.75 nanometer (nm), or at least 1 nm more than a thickness of the second section of the layer. Numerous configurations and variations will be apparent in light of this disclosure.

General Overview

As noted above, there remain a number of non-trivial issues with respect to interconnect structures having memory embedded therein. Consider, for instance, the competing interests of word lines and bit lines. In more detail, logic signals such as word line signals of a memory cell may be able to withstand higher ohmic resistance, but prefer a lower capacitance path to achieve sufficient access speed. So, for example, a word line may benefit from the relatively low parasitic capacitance attributable to a short height and not be excessively encumbered due to the higher resistance attributable to a narrow width. In contrast, power signals such as bit line signals of a memory cell may be able to withstand higher capacitance, but prefer a lower resistance path to achieve less power consumption. So, for example, a bit line may benefit from the relatively low resistance attributable to a tall and wide configuration and not be excessively encumbered due to the attendant higher parasitic capacitance. Thus, there are conflicting requirements of height and width of various interconnect features.

Accordingly, techniques are provided herein to address the competing interests of embedded memory interconnect features. In an example, an integrated circuit (IC) is configured to simultaneously (i) provide shorter and narrower paths for a first type of signals (e.g., logic signals such as word line signals) thereby providing relatively low capacitance paths for the first type of signals, and (ii) provide taller and wider paths for a second type of signals (e.g., power signals such as bit line signals) thereby providing relatively low resistance paths for the second type of signals. For example, within an upper interconnect layer (e.g., interconnect layer 136, see FIGS. 1A-1C), an additional deck of metallization level (sometimes referred to herein as MD0) is introduced for the second type of signals, but not for the first type of signals. As described below, such a selective metallization level MD0 addresses the above discussed conflicting requirements of the first and second types of signals.

In an example, a lower interconnect layer (e.g., interconnect layer 132 of FIG. 1A) includes conductive interconnect features, which may be conductive lines, for example. For example, the lower interconnect layer includes (i) a first narrow interconnect feature (e.g., interconnect feature 104*a*, see FIGS. 1A-1C), which may be a conductive line, for the first type of signal, and (ii) a first wide interconnect feature (e.g., interconnect feature 108*a*, see FIGS. 1A-1C), which may be a wide conductive line, for the second type of signal. The lower interconnect layer may be part of a lower metallization level (e.g., in some examples referred to herein as M0 metallization level).

In an example, the upper interconnect layer includes (i) a second narrow interconnect feature (e.g., interconnect feature 112*a*, see FIGS. 1A-IC), which may be a conductive via, for the first type of signal, and (ii) a second wide interconnect feature (e.g., interconnect feature 116*a*, see FIGS. 1A-1C), which may be another wide conductive line, for the second type of signal. The second wide interconnect feature may be above, and in contact with, the first wide interconnect feature. The second wide interconnect feature may be part of a mid-level or double-decked metallization level MD0. A third narrow interconnect feature (e.g., interconnect feature 120*a*, see FIGS. 1A-1C), which may be another narrow conductive via, is above and in contact with the second wide interconnect feature. The combination of the second wide interconnect feature and the third narrow interconnect feature extends from an upper surface of the first wide interconnect feature to an upper surface of the upper interconnect layer. On the other hand, the second narrow interconnect feature extends from an upper surface of the first narrow interconnect feature to the upper surface of the upper interconnect layer.

Thus, the first type of signal is transmitted through the first narrow interconnect feature and the second narrow interconnect feature, whereas the second type of signal is transmitted through the first wide interconnect feature, the second wide interconnect feature, and the third narrow interconnect feature. Note that a height of the second narrow interconnect feature is h1, whereas a height of the second wide interconnect feature is h2 (see FIG. 1B for the heights h1 and h2), where h1 is greater than h1.

Because the first wide interconnect feature and the second wide interconnect feature forms a combined wide and tall interconnect feature, an ohmic resistance of this combined wide and tall interconnect feature is relatively less, which provides a relatively low resistance path for the second type of signal. On the other hand, the first narrow interconnect feature and the second narrow interconnect feature provides a relatively high resistance, but low capacitance, path for the first type of signal. Note that because the first narrow interconnect feature (which may be a narrow conductive line, see FIG. 1C) and the second narrow interconnect feature (which may be a narrow conductive via, see FIG. 1C) are both narrow, the capacitance of this path for the first type of signal is also low, which is crucial for the first type of signal. Various narrow and wide width ranges for various interconnect features have been discussed herein below in further detail.

In one embodiment, each of the above discussed interconnect features comprise conductive fill material, and conductive barrier or liner layer on sidewalls and/or bottom surface of the conductive fill material. In an example, the conductive fill material of an interconnect feature tends to diffuse within adjacent dielectric material. The barrier or liner layers, in an example, prevent or reduce diffusion of the conductive fill material of an interconnect feature to adjacent dielectric material. In another example, the barrier or liner layers of an interconnect feature facilitate better adhesion of the conductive fill material on walls of the interconnect feature.

In an example, a section of the barrier layer on a bottom surface of the above discussed second wide interconnect feature is made relatively thin, e.g., thinner than another section of the barrier layer of side surfaces of the second wide interconnect feature. Thus, the relatively thick section of the barrier layer of side surfaces of the second wide interconnect feature prevents, or otherwise reduces, diffusion of the conductive fill material to adjacent dielectric material. The relatively thin section of the barrier layer of the bottom surface of the second wide interconnect feature ensures that the resistance between the first wide and second wide interconnect features are relatively low. Thus, the previously discussed combined wide interconnect feature (which is a combination of the first wide and second wide interconnect features) is relatively low. Example materials and widths of the barrier layers have been discussed herein below in further detail.

In an example, the varying thickness of the barrier layer of the second wide interconnect feature may be achieved through a selective deposition process. For example, after a recess (e.g., recess 316*a*, see FIG. 3C) in the dielectric material of the upper interconnect layer is formed (e.g., for formation of the second wide interconnect feature), the barrier layer is deposited lining the sidewalls and bottom surfaces of the recess. The deposition process is selective, such that a thin section of the layer is deposited on the bottom surface and a thick section of the layer is deposited on the sidewalls. In an example, such selective deposition is achieved using a selective atomic layer deposition (ALD) process, although another selective deposition process may also be used.

As previously discussed herein, the third narrow interconnect feature (which may be a conductive via) is above, and in contact with, the second wide interconnect feature (which may be a conductive line). In an example, when forming the third narrow interconnect feature, a recess etching process (where the third narrow interconnect feature is to be formed within the recess, such as recess 320*a* of FIG. 4G) may damage the conductive material of the second wide interconnect feature. Accordingly, in an example, a relatively thick capping layer (e.g., thick capping layer 115*a*3, see FIG. 1A) may be formed above the conductive fill material of the second wide interconnect feature. Example thickness and materials of the capping layer has been discussed herein below in further detail.

In an example, to form the structure discussed herein above, the lower interconnect layer comprising the first wide and first narrow interconnect features are formed. Note that while the above discussion focuses on some example wide and narrow interconnect features, the structure may include several such wide and narrow interconnect feature. Subsequently, an etch stop layer is deposited above the lower interconnect layer. Then a bottom section of dielectric material of the upper interconnect layer is deposited, where the bottom section of dielectric material of the upper interconnect layer has a height of h2 (see FIG. 4B). As discussed above, height h2 is the height of the second wide interconnect feature. A recess for the second wide interconnect feature is formed, e.g., see recess 316*a* of FIG. 4C. The above discussed selective deposition process, such as a selective ALD process, is then used to form varying thickness sections of the barrier layer within the recess, such that a thin section of the layer is deposited on the bottom surface and a thick section of the layer is deposited on the sidewalls of the recess, as discussed herein above. Conductive fill material is then deposited within the recess, followed by formation of the above discussed thick capping layer, thereby forming the second wide interconnect feature above the first wide interconnect feature.

Subsequently, additional dielectric material of the upper interconnect layer is deposited, such that the height of the dielectric material is now h1, see FIG. 4F. Subsequently, a first recess for the second narrow interconnect feature is formed above the first narrow interconnect feature, e.g., see recess 312*a* of FIG. 4G. Similarly, a second recess for the third narrow interconnect feature is formed above the second wide interconnect feature, e.g., see recess 320*a* of FIG. 4G. The second and third narrow interconnect features are then respectively formed over the first and second recesses. An etch stop layer is then formed above the second and third narrow interconnect features, thereby completing the formation of the upper interconnect layer.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For example, in some embodiments, such tools may be used to detect (i) a lower interconnect layer (e.g., which may be a lower metallization level) comprising one or more lower narrow interconnect features and one or more lower wide interconnect features, and (ii) an upper interconnect layer comprising one or more upper narrow interconnect features and one or more upper wide interconnect features. For example, a first upper narrow interconnect feature may be formed above a first lower narrow interconnect feature, where the vertical stack of the first lower narrow interconnect feature and the first upper narrow interconnect feature is used to transmit a first type of signal. An upper wide interconnect feature may be formed above a lower wide interconnect feature, and a second upper narrow interconnect feature may be formed above the upper wide interconnect feature. In an example, the vertical stack of the lower wide interconnect feature, the upper wide interconnect feature, and the second upper narrow interconnect feature is used to transmit a second type of signal. In an example, the upper wide interconnect feature forms a mid-level or double-decked metallization level for the second type of signal, where the signal path for the first type of signal lacks the mid-level or double-decked metallization level. In an example, such tools may also be used to detect the upper wide interconnect feature having (i) relatively thick section of the barrier layer on side surfaces, (ii) relatively thin section of the barrier layer on a bottom surface, and (iii) relatively thick capping layer on an upper surface. Numerous configurations and variations will be apparent in light of this disclosure.

Architecture

FIG. 1A illustrates a cross-section view of an integrated circuit structure 100 (also referred to herein as "structure

100") comprising (i) a lower interconnect layer 132 including a first interconnect feature 104*a* and a second interconnect feature 108*a*, and (ii) an upper interconnect layer 136 above the lower interconnect layer 132, the upper interconnect layer 136 including a third interconnect feature 112*a*, a fourth interconnect feature 116*a*, and a fifth interconnection feature 120*a*, wherein the third interconnect feature extends from an upper surface of the first interconnect feature 104*a* to an upper surface of the upper interconnect layer 136, wherein the fourth interconnect feature 116*a* extends from an upper surface of the second interconnect feature 108*a* to below the upper surface of the upper interconnect layer 136, and wherein the fifth interconnect feature 120*a* extends from an upper surface of the fourth interconnect feature 116*a* to the upper surface of the upper interconnect layer 136, in accordance with an embodiment of the present disclosure.

As illustrated, the structure 100 comprises the lower interconnect layer 132, and the upper interconnect layer 136 above the lower interconnect layer 132. An etch stop layer 133 is between the upper and lower interconnect layers 132, 136. Another etch stop layer 137 is above the upper interconnect layer 136. In an example, each etch stop layer acts to stop an etch process occurring in an interconnect layer above the etch stop layer. For example, the etch stop layer 133 stops an etch process occurring through a dielectric material 134 of the interconnect layer 136 (e.g., the etch stop layer 133 stops the etch process to form the recesses 312 and 320, see FIG. 4G). The etch stop layers 133, 137 comprise any appropriate dielectric materials, such as silicon nitride and/or other appropriate dielectric materials, in an example.

The lower interconnect layer 132 comprises dielectric material 130, and a plurality of interconnect features 104*a*, 108*a*, 104*b*, 108*b*, and 104*c* extending through the dielectric material 130. Note that a number and/or location of the various interconnect features illustrated in FIG. 1A are mere examples.

Each interconnect feature comprises conductive fill material (e.g., one or more metals and/or alloys thereof) and one or more barrier or liner layers at least in part around the conductive fill material. For example, the conductive fill material of an interconnect feature tends to diffuse within adjacent dielectric material. In an example where the conductive fill material is copper, the diffusion may result in formation of undesirable copper oxide. The barrier or liner layers, in an example, prevent or reduce diffusion of the conductive fill material of an interconnect feature to adjacent dielectric material of the corresponding interconnect layer. In another example, the barrier or liner layers of an interconnect feature facilitate better adhesion of the conductive fill material on walls of the interconnect feature.

For example, the interconnect feature 104*a* comprises conductive fill material 102*a* (also referred to herein simply as conductive material 102*a*) and barrier layer 103*a*; the interconnect feature 108*a* comprises conductive material 106*a* and barrier layer 107*a*; the interconnect feature 104*b* comprises conductive material 102*b* and barrier layer 103*b*; the interconnect feature 108*b* comprises conductive material 106*b* and barrier layer 107*b*; and the interconnect feature 104*c* comprises conductive material 102*c* and barrier layer 103*c*. As illustrated, for each of the interconnect features of the lower interconnect layer 132, the corresponding barrier layers are on sidewalls and on a bottom surface of the interconnect feature. Suitable materials for the barrier layers (which may also be referred to herein as liner layers) of the various interconnect features include barrier layer refractory metals and alloys, cobalt, cobalt-nickel (CoNi), ruthenium-cobalt combination, molybdenum, nickel, manganese, titanium-tungsten (Ti), tantalum (Ta), tantalum-nitride (TaN), tantalum-silicon-nitride (TaSiN), titanium-nitride (TiN), titanium-silicon-nitride (TiSiN), tungsten (XV), tungsten-nitride (WN), tungsten-silicon-nitride (WiSiN), and/or combinations of such materials (e.g., a multi-lay stack of Ta/TaN). In an example, the conductive fill materials of the various interconnect features comprises suitable conductive materials such as pure copper, ruthenium, molybdenum, tungsten, aluminum, an alloy such as copper-tin (CuSn), copper indium (CuIn), copper-antimony (CuSb), copper-bismuth (CuBi), copper-rhenium (CuRe), and/or any other suitable conductive material.

As illustrated, the interconnect features 102*a*, 102*b*, 102*c* have substantially a same width w5, where the width w5 is measured in a horizontal direction that is perpendicular to an imaginary vertical line passing through the interconnect features 108*a*, 116*a*, and 120*a*. For example, the widths of each of the interconnect features 102*a*, 102*b*, 102*c* is within 0.5 nm or 1 nm of the width w5.

Note that in an example, at least some of the interconnect features is tapered towards the bottom. For example, a width of a lower section of an interconnect feature is less than a width of an upper section of the interconnect feature. The tapering may be due to formation of recesses (e.g., within which the interconnect features are to be eventually formed) from a top-side or front side of the structure. In some other examples, the interconnect features may not be tapered. In an example, due to the tapering, the horizontal width of an interconnect feature (such as interconnect feature 104*a*) may vary along a vertical length of the interconnect feature. Accordingly, the width of an interconnect feature (such as width w5) is an average width and/or is measured about half-way along the vertical length of the interconnect feature.

As illustrated, the interconnect features 108*a*, 108*b* have substantially a same width w6, where the width w6 is measured in a horizontal direction that is perpendicular to an imaginary vertical line passing through the interconnect features 108*a*, 116*a*, and 120*a*. For example, the widths of each of the interconnect features 108*a*, 108*b* is within 0.5 nm or 1 nm of the width w6. Similar to the discussion with respect to the width w5, the width w6 of the interconnect feature 108*a* is an average width, e.g., measured about half-way along the vertical length of the interconnect feature 108*a*.

In an example, the width w6 is greater than the width w5, as illustrated. For example, the width w6 is at least 1 nm, or at least 2 nm, or at least 3 nm, or at least 4 nm, or at least 5 nm greater than the width w5. In an example, the width w6 is in the range of 20 nm to 40 nm, or in the subrange of 20-36 nm, or 20-30 nm, or 20-25 nm, or 26-40 nm, or 26-36 nm, or 26-32 nm, or another appropriate subrange thereof. In an example, the width w5 is in the range of 8 nm to 25 nm, or in the subrange of 8-20 nm, or 8-12 nm, or 15-25 nm, or 15-20 nm, or another appropriate subrange thereof. In an example, width w6 is at least 5%, or at least 10%, or at least 15%, or at least 20%, or at least 25% greater than the width w5.

In an example, signals that demand relatively low resistance are transmitted through one or both the interconnect features 108*a*, 108*b*, and signals that can tolerate relatively high resistance are transmitted through one or more of the interconnect features 104*a*, 104*b*, 104*c*. For example, the interconnect features 104*a*, 104*b*, 104*c* having the narrow width w5 may be used for communicating logic signals, and the interconnect features 106*a*, 106*b* having the wide width w6 may be used for communicating analog signals and/or power signals. For example, in the context of a memory array, one or more of the narrower interconnect features 104*a*, 104*b*, 104*c* are used to transmit word line (WL) signals and/or memory VCC signal, whereas one or more of the wider interconnect features 108*a*, 108*b* are used to transmit bit line (BL) and/or bit line bar (BLB) signals. For example, FIG. 2 illustrates the structure 100 of FIG. 1A coupled to various lines of a memory cell (such as a static random-access memory (SRAM) memory cell), in accordance with an embodiment of the present disclosure.

Figure 2:
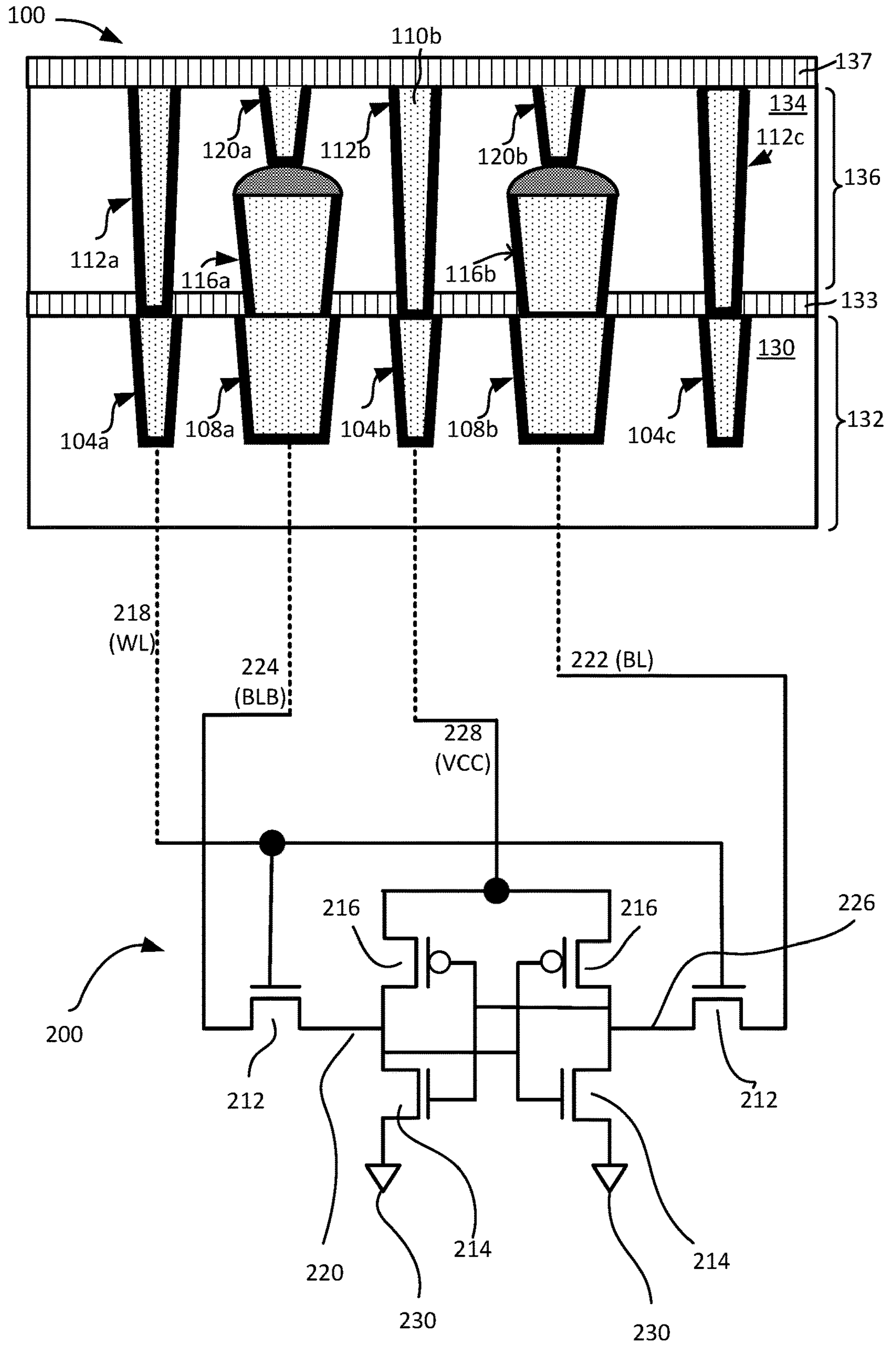
FIG. 2 illustrates the structure of FIG. 1A coupled to various lines of a memory cell (such as a static random-access memory (SRAM) memory cell), in accordance with an embodiment of the present disclosure.

Referring to FIG. 2, a bit cell area 200 of the memory cell includes access transistors 212, N-type cell transistors 214, and P-type cell transistors 216. Also depicted are a WL 218, a bit bar (BB) 220, a bit line (BL) 222, a bit line bar (BLB) 224, internal node storage (BT) 226, SRAM VCC 228, and VSS 230. As illustrated in FIG. 2 (e.g., using dotted lines), the interconnect feature 104*a* forms, or otherwise is coupled to, the WL 218; the interconnect feature 108*a* forms, or otherwise is coupled to, the BLB 224; the interconnect feature 104*b* forms, or otherwise is coupled to, the VCC 228; and the interconnect feature 108*b* forms, or otherwise is coupled to, the BL 222. Thus, each of the wider interconnect features 108*a*, 108*b* is coupled to a corresponding one of the BL 222 or the BLB 224; and each of the narrower interconnect features 104*a*, 104*b* is coupled to a corresponding one of the WL 218 or the VCC 228. For example, the BL and/or the BLB transmits relatively higher current and warrants wider interconnect features, such as interconnect features 108*a*, 108*b*. On the other hand, the logic line WL 218 and/or the VCC 228 transmits relatively lower current and accordingly, narrower interconnect features 104*a*, 104*b* may be used for these signals.

Note that FIG. 2 illustrates a specific configuration of a six-transistor (6T) SRAM memory cell. However, any appropriate configuration of SRAM memory cells may be used instead. Similarly, another appropriate type of memory cell may be used, such as a dynamic random-access memory (DRAM) memory cell. For example, any appropriate type of memory cell may be used, e.g., with the BL and/or the BLB forming, or otherwise being coupled to, a corresponding one of the wider interconnect features (e.g., interconnect features 108*a*, 108*b*); and with the WL (and possibly the VCC) forming, or otherwise being coupled to, a corresponding one of the narrower interconnect features (e.g., interconnect features 104*a*, 104*b*, 104*c*).

Referring again to FIG. 1A, the upper interconnect layer 136 comprises dielectric material 134, and a plurality of interconnect features 112*a*, 120*a*, 116*a*, 112*b*, 120*b*, 116*b*, and 112*c* extending through the dielectric material 134. As previously discussed with respect to the interconnect features of the lower interconnect layer 132, each interconnect feature 112*a*, 120*a*, 116*a*, 112*b*, 120*b*, 116*b*, and 112*c* of the upper interconnect layer 136 comprises conductive fill material (e.g., one or more metals and/or alloys thereof) and one or more barrier or liner layers at least in part around the conductive fill material.

For example, the interconnect feature 112*a* comprises conductive material 110*a*, and barrier layer 111*a* on sidewalls and bottom surface of the conductive material 110*a*; the interconnect feature 120*a* comprises conductive material 118*a*, and barrier layer 119*a* on sidewalls and bottom surface of the conductive material 118*a*; the interconnect feature 112*b* comprises conductive material 110*b*, and barrier layer 112*b* on sidewalls and bottom surface of the conductive material 110*b*; the interconnect feature 120*b* comprises conductive material 118*b*, and barrier layer 119*b* on sidewalls and bottom surface of the conductive material 118*b*;

and the interconnect feature 112*c* comprises conductive material 110*c*, and barrier layer 111*c* on sidewalls and bottom surface of the conductive material 110*c*. Example composition of each of the conductive materials and barrier layers for various interconnect features have been discussed herein above with respect to the interconnect features of the lower interconnect layer 132.

In an example, a width of each barrier layer of the interconnect features 112*a*, 112*b*, 112*c*, 120*a*, and 120*b* is substantially the same, e.g., within 0.5 nm or 1 nm of each other. In an example, the width of each barrier layer of the interconnect features 112*a*, 112*b*, 112*c*, 120*a*, and 120*b* is substantially equal to the above discussed width w1.

In one embodiment, the interconnect feature 116*a* comprises conductive material 114*a*, section 115*al* of a barrier layer on sidewalls of the conductive material 114*a*, section 115*a*2 of the barrier layer on bottom surface of the conductive material 114*a*, and a capping layer 115*a*3 on a top surface of the conductive material 114*a*, as illustrated in FIG. 1A. In an example, the interconnect feature 116*a* is vertically between the interconnect feature 108*a* and interconnect feature 120*a*. For example, the interconnect feature 116*a* electrically couples the interconnect feature 108*a* and interconnect feature 120*a*.

Similarly, the interconnect feature 116*b* comprises conductive material 114*b*, section 115*b*1 of a barrier layer on sidewalls of the conductive material 114*b*, section 115*b*2 of the barrier layer on bottom surface of the conductive material 114*b*, and a capping layer 115*b*3 on a top surface of the conductive material 114*b*, as also illustrated in FIG. 1A. In an example, the interconnect feature 116*b* is vertically between the interconnect feature 108*b* and interconnect feature 120*b*. For example, the interconnect feature 116*b* electrically couples the interconnect feature 108*b* and interconnect feature 120*b*.

In an example, the interconnect features 116*a* and 116*b* have similar shape and dimensions. Various features and dimensions of the interconnect feature 116*a* are discussed herein below, and such discussion also applies to the interconnect feature 116*b*.

As illustrated, the interconnect features 108*a*, 116*a*, and 120*a* form a vertical stack of interconnect features. A vertical stack of interconnect features 116*a* and 120*a* extends between the etch stop layer 133 and the etch stop layer 137 (note that the interconnect feature 116*a* extends through the etch stop layer 133, to contact the upper surface of the interconnect feature 108*a*). The interconnect features 116*a* and 120*a* makes contact at a plane between the two etch stop layers 133, 137. The interconnect features 116*b*, 120*b* have similar configuration. Also, each of the interconnect features 112*a*, 112*b*, 112*c* extends from the lower etch stop layer 133 to the upper etch stop layer 137. As illustrated, each of the interconnect features 112*a*, 112*b*, 112*c* extends through the lower etch stop layer 133, to respectively make contact with the interconnect features 104*a*, 104*b*, 104*c*.

As illustrated, the upper surfaces of the interconnect features 104*a*, 108*a*, 104*b*, 108*b*, 104*c* are substantially coplanar (e.g., vertically separated by at most 0.5 nm, or at most 1 nm, or at most 1.5 nm). For example, at least a section of the upper surface of the any of the interconnect features of the interconnect layer 132 is within a first horizontal plane, at least a section of the upper surface of another interconnect feature of the interconnect layer 132 is within a second horizontal plane, and wherein the first and second horizontal planes are vertically separated by at most 0.5 nm, or at most 1 nm, or at most 1.5 nm.

As illustrated, the upper surfaces of the interconnect features 112*a*, 120*a*, 112*b*, 120*b*, 112*c* are substantially coplanar (e.g., vertically separated by at most 0.5 nm, or at most 1 nm, or at most 1.5 nm). For example, at least a section of the upper surface of the any of the interconnect features of the interconnect layer 136 is within a third horizontal plane, at least a section of the upper surface of another interconnect feature of the interconnect layer 136 is within a fourth horizontal plane, and wherein the third and fourth horizontal planes are vertically separated by at most 0.5 nm, or at most 1 nm, or at most 1.5 nm. In one embodiment, a lateral separation between two laterally adjacent interconnect features (e.g., lateral distance between the interconnect features 104*a* and 108*a*, or lateral distance between the interconnect features 112*a* and 116*a*) is at most 30 nm, or at least 50 nm, or at least 80 nm, or at least 100 nm, or at least 150 nm, or at least 200 nm, or at least 300 nm, or at least 400 nm.

As illustrated, a height of each of the interconnect features 112*a*, 112*b*, 112*c* is substantially equal to (e.g., within 0.5 nm, or 1 nm) of a sum of heights of the interconnect features 116*a*, 120*a* (or interconnect features 116*b*, 120*b*). In an example, a height of each of the interconnect features 112*a*, 112*b*, 112*c* is h1, and a height of each of the interconnect features 116*a*, 116*b* is h2 (height h2 is labelled in FIG. 1*i*). In an example, height h2 is in the range of 10 to 30 nm, or in a subrange of 10-25, 10-20, 15-30, 15-25, 20-30 nm, or in another appropriate subrange thereof. In an example, height h1 is in the range of 25 to 50 nm, or in a subrange of 25-40, 25-30, 30-50, 30-40, 30-35 nm, or in another appropriate subrange thereof. In an example, the height h1 is greater than the height h2 by at least 2 nm, or at least 4 nm, or at least 5 nm, or at least 8 nm, or at least 10 nm, or at least 12 nm.

As discussed herein above, the interconnect feature 116*a* comprises a section 115*al* of a barrier layer on sidewalls of the conductive material 114*a* and another section 115*a*2 of the barrier layer on bottom surface of the conductive material 114*a*. In an example, the sections 115*al* and 115*a*2 of the barrier layer have different widths or thicknesses. For example, as illustrated in FIG. 1A, the section 115*al* (on sidewalls of the interconnect feature 116*a*) has a horizontal width or thickness of w2, and the section 115*a*2 (on bottom surface of the interconnect feature 116*a*) has a vertical width or thickness of w3. In an example, the thickness w3 is substantially lower than the thickness w2. For example, the thickness w3 is lower than the thickness w2 by at least 10%, or 15%, or 20%, or 25%, or 30%, or 35%, or 40%. For example, the thickness w2 is in the range of 1 to 4 nm, whereas the thickness w3 is in the range of 0.2 to 1.5 nm. In an example, the thickness w3 is lower than the thickness w2 by at least 0.5 nm, or at least 0.75 nm, or at least 1 nm, or at least 1.25 nm, or at least 1.5 nm, or at least 2 nm, or at least 3 nm.

In an example, the section 115*al* of the barrier layer on sidewalls of the interconnect feature 116*a* prevents, or reduces diffusion of the conductive material 114*a* within the adjacent dielectric material 134. On the other hand, the section 115*a*2 of the barrier layer is between the conductive materials 114*a* and 106*a* of the interconnect features 116*a* and 108*a*, respectively. Although the section 115*a*2 comprises conductive material, a relatively thick section 115*a*2 may increase an ohmic resistance between the conductive materials 114*a* and 106*a*. Accordingly, the section 115*a*2 is made relatively thinner (e.g., compared to the section 115*a*1), so as to reduce the ohmic resistance between the interconnect features 116*a* and 108*a*. Formation of the relatively thick section 115*al* and relatively thin section 115*a*2 of the barrier layer will be discussed herein below in further detail with respect to FIG. 4D.

In an example, a section 115*b*1 of a barrier layer of sidewalls of the interconnect feature 116*b* similarly has a width of w2 and a section 115*b*2 of the barrier layer on bottom surface of the interconnect feature 116*b* similarly has a width of w3, where the widths w2 and w3 have been discussed herein above with respect to the interconnect feature 116*a*.

In one embodiment, the interconnect feature 116*a* comprises the capping layer 115*a*3 and the interconnect feature 116*b* comprises the capping layer 115*b*3. In an example, each of the capping layers 115*a*3 and 115*b*3 has a maximum vertical height (which is also a maximum thickness) of w7 (thickness w7 is labelled for the capping layer 115*a*3 in FIG. 1A). In an example, the thickness w7 is in the range of 1 to 5 nm, or in the subrange of 1 to 4 nm, 1 to 3 nm, 2 to 5 nm, 2 to 3 nm, 2.5 to 3.5 nm, or another appropriate subrange thereof. In an example, the capping layer 115*a*3 (or the capping layer 115*b*3) is made relatively thick, e.g., to prevent full punch through of the capping layer 115*a*3 when a recess (e.g., recess 320*a*, see FIG. 4G) for the interconnect feature 120*a* is being formed. For example, the relatively thick capping layer 115*a*3 ensures that even if an etch process to form the recess within the dielectric material 134 for the interconnect feature 120*a* somewhat extends through the capping layer 115*a*3, the etch process does not substantially damage the interconnect feature 116*a* or does not reach the conductive material 114*a*. In an example, suitable materials for the capping layers include, but are not limited to, cobalt, cobalt-nickel (CoNi), ruthenium-cobalt combination, molybdenum, nickel, manganese, titanium-tungsten (Ti), tantalum (Ta), tantalum-nitride (TaN), tantalum-silicon-nitride (TaSiN), titanium-nitride (TiN), titanium-silicon-nitride (TiSiN), tungsten (XV), tungsten-nitride (WN), tungsten-silicon-nitride (WiSiN), and/or combinations of such materials (e.g., a multi-lay stack of Ta/TaN).

Figure 1B:
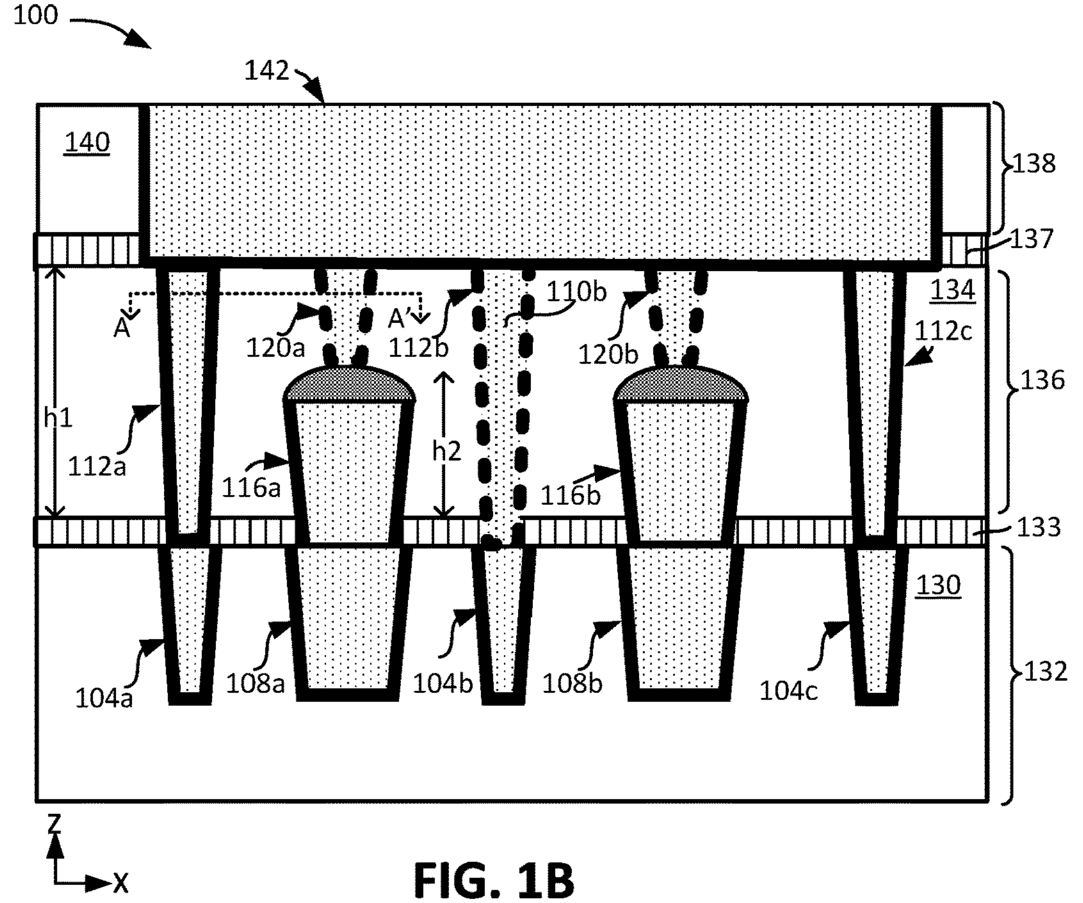
FIG. 1B illustrates the structure of FIG. 1A, with an additional interconnect layer above the structure illustrated in FIG. 1A, in accordance with an embodiment of the present disclosure.

FIG. 1B illustrates the structure 100 of FIG. 1A, with an additional interconnect layer 138 above the structure illustrated in FIG. 1A, in accordance with an embodiment of the present disclosure. In an example, the interconnect features 112*a*, 116*a*, 116*b*, and/or 112*c* of the interconnect layer 136 may be in a first plane, which may be the plane of the paper in which the figures are drawn. On the other hand, in an example, the interconnect features 120*a*, 112*b*, and/or 120*b* may be in one or more other planes different from the first plane, where the other planes may be in front of and/or in the back of the paper in which the figures are drawn. Thus, in an example, the interconnect features 120*a*, 112*b*, 120*b* may not be visible in the cross-sectional view of FIG. 1B. Accordingly, the interconnect features 120*a*, 120*b*, and 112*b* are illustrated using dotted lines (specifically, the barrier layers of these interconnect features are illustrated using dotted lines), to illustrate the differences in the plane of the various interconnect features. Note that the interconnect features 120*a*, 120*b*, and/or 112*b* being out of plane is merely an example, and in another example, one or more other interconnect features may also be out of the plane of the paper.

Also illustrated in FIG. 1B is an interconnect layer 138 above the etch stop layer 137. In an example, the interconnect layer 138 comprises an interconnect feature 142, which includes a barrier layer and conductive fill material therewithin (although these components are not separately labelled in FIG. 1). In the example of FIG. 1B where the dotted interconnect features are out of plane of the paper (see above discussion), the interconnect feature 142 is coupled to both the interconnect features 112*a* and 112*c* (which are, in one example, WLs of a memory device, see FIG. 2). Note that the interconnect feature 142 of the interconnect layer 138 is merely an example, and in another example (and unlike FIG. 1), the interconnect layer 138 may have a first interconnect feature coupled to the interconnect feature 112*a*, and a second interconnect feature coupled to the interconnect feature 112*c*.

Referring now to FIGS. 1A and 1B, the previously discussed relatively narrow interconnect feature 104*a* is coupled to another narrow interconnect feature 112*a*, where interconnect feature 112*a* traverses through the interconnect layer 136. For example, the interconnect feature 112*a* extends from an upper surface of the interconnect feature 104*a* to an upper surface of the interconnect layer 136. Similarly, the interconnect feature 112*b* extends from an upper surface of the interconnect feature 104*b* to the upper surface of the interconnect layer 136; and the interconnect feature 112*c* extends from an upper surface of the interconnect feature 104*c* to the upper surface of the interconnect layer 136. Thus, in general, there is a single level of single deck of interconnect feature 112 between an interconnect feature 104 and the upper surface of the interconnect layer 136.

On the other hand, there are two (or can be even more, such as three or four) decks or levels of interconnect features between an interconnect feature 108 and the upper surface of the interconnect layer 136. For example, the interconnect feature 116*a* extends from an upper surface of the interconnect feature 108*a* to a plane that is lower than the upper surface of the interconnect layer 136, and the interconnect feature 120*a* extends from an upper surface of the interconnect feature 116*a* to the upper surface of the interconnect layer 136. Similarly, the interconnect feature 116*b* extends from an upper surface of the interconnect feature 108*b* to the plane that is lower than the upper surface of the interconnect layer 136, and the interconnect feature 120*b* extends from an upper surface of the interconnect feature 116*b* to the upper surface of the interconnect layer 136.

The wider interconnect features 108 and 116 offers lower resistance paths for some signals (e.g., BL and BLB, see FIG. 2 and associated discussion). In contrast, because such low resistance path may not be crucial for some other signals (e.g., WL, see FIG. 2 and associated discussion), the narrower interconnect features 104 and 112 may be used for these signals. In an example, these other signals, which can withstand relatively higher resistance, may prefer lower capacitance, which may be offered by the relatively narrower width interconnect features 104, 112. In an example, the interconnect feature 112 may be a conductive vertical via (see FIG. 1C), and the narrow via offer a low capacitance path for signals traversing through the interconnect features 104*a*, 112*a*.

In an example, the interconnect features 104*a*, 108*a*, 104*b*, 108*b*, 104*c* form a lower or M0 metallization level of the structure 100. Note that "M0" implies a lowest metallization level in an example, but in another example, there may be further metallization levels below the M0 metallization level.

In an example, the interconnect features 116*a* and 116*b* may be considered as a metallization level for the interconnect features 108*a*, 108*b*, respectively. The metallization level comprising the interconnect features 116*a*, 116*b* may be referred to as an MD0 metallization level (where "M" stands for metallization level, "D" stands for "double-deck", and "0" stands for a double-decked $0^{th}$ metallization level).

As illustrated, the MD0 metallization level is for the wider interconnect features 108_a_, 108_b_. The interconnect features 104_a_, 104_b_, 104_c_ lack any such metallization level.

Adding the MD0 metallization level and using wider interconnect features 108, 116 results in low resistance paths for some signals (e.g., BL and BLB, see FIG. 2 and associated discussion), which is desirable for such signals. On the other hand, not providing the MD0 metallization level and using narrower interconnect features 104, 112 provides low capacitance paths (albeit with somewhat high resistance) for some other signals (e.g., WL, see FIG. 2 and associated discussion), which is desirable for these other signals.

In an example, the interconnect layer 138 forms M1 metallization level of the structure 100. Thus, for example, the interconnect feature 112_a_ couples the interconnect feature 104_a_ of the M0 metallization level to the interconnect feature 142 of the M1 metallization level. On the other hand, the interconnect feature 120_a_ couples the interconnect feature 116_a_ of the MD0 metallization level to another interconnect feature (not illustrated in FIG. 1B) of the M1 metallization level.

Figure 1C:
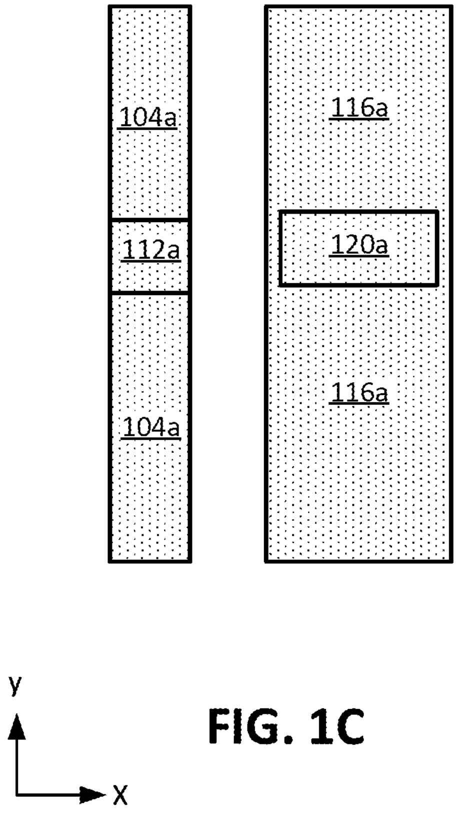

FIG. 1C illustrates a top-down view of a section of the structure 100 of FIGS. 1A and 1, in accordance with an embodiment of the present disclosure. For example, the top-down view of FIG. 1C is along line A-A' of FIG. 1B, and illustrates only some of the interconnect features of the structure 100. For example, as illustrated in the top-down view, the interconnect feature 104_a_ is a conductive line traversing along the Y-axis direction. Similarly, the interconnect feature 116_a_ is another conductive line traversing along the Y-axis direction. Although the interconnect feature 108_a_ is not visible in the top-down view (as it is covered by the conductive line 116_a_), the interconnect feature 108_a_ is yet another conductive line traversing along the Y-axis direction. For example, each of one or more (e.g., all) of the interconnect features (e.g., 104_a_, 108_a_, 104_b_, 108_b_, and/or 104_c_) of the M0 metallization level (e.g., the interconnect layer 132) is a conductive line traversing along the Y-axis direction. Similarly, each of one or more (e.g., all) of the interconnect features (e.g., 116_a_ and/or 116_b_) of the MD0 metallization level is a conductive line traversing along the Y-axis direction. In contrast, in an example, the remaining interconnect features 112_a_, 120_a_, 112_b_, 120_b_, and/or 112_c_ of the interconnect layer 136 are conductive vias extending vertically in the Z-axis direction.

Figure 3:
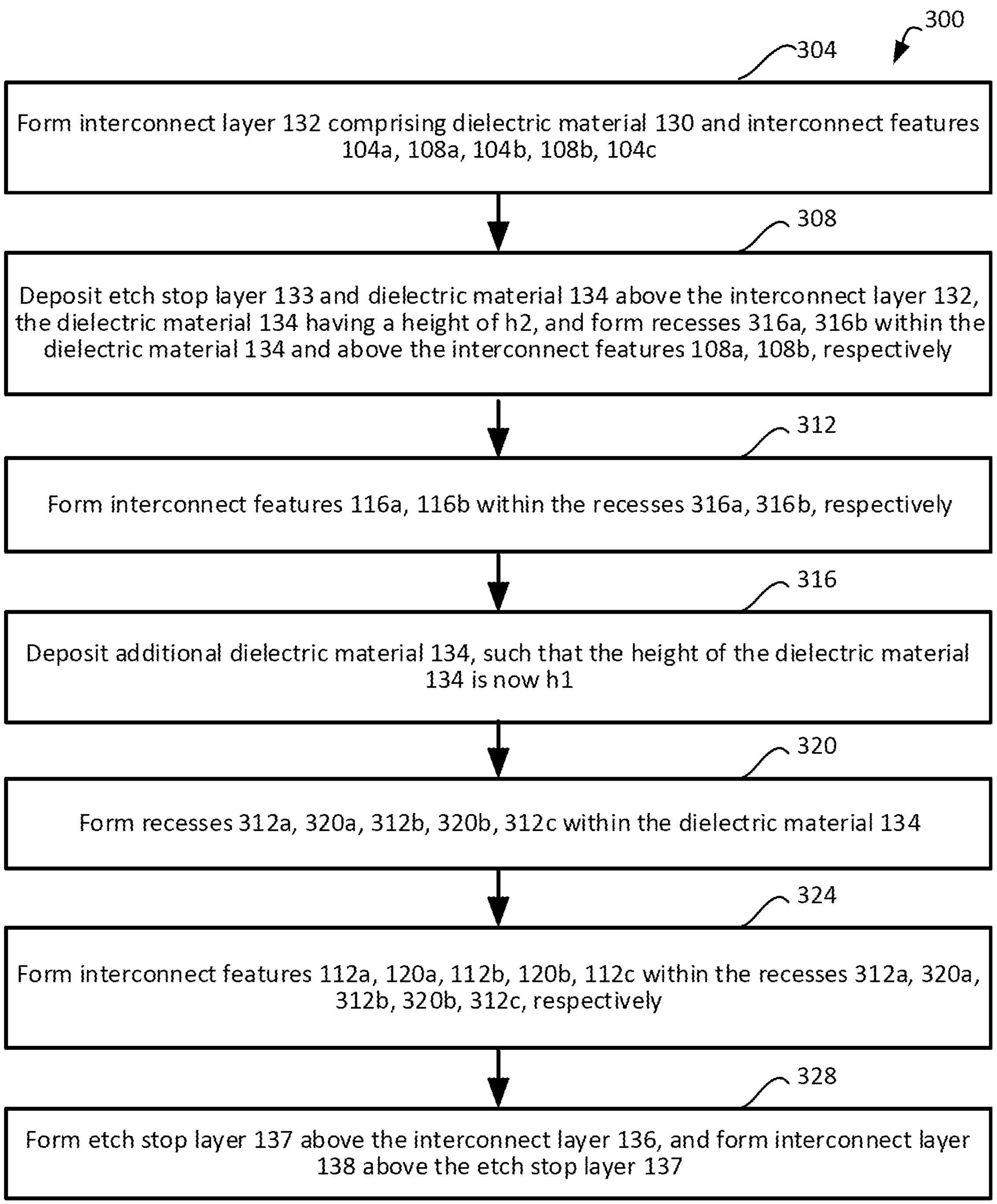
FIG. 3 illustrate a flowchart depicting a method of forming the example semiconductor structure of FIGS. 1A-C and 2, in accordance with an embodiment of the present disclosure.

FIG. 3 illustrate a flowchart depicting a method 300 of forming the example semiconductor structure 100 of FIGS. 1A and 1_i_, in accordance with an embodiment of the present disclosure. FIGS. 4A, 4B, 4C, 4D, 4E, 4F, 4G, 4H, and 4I collectively illustrate cross-sectional views of an example semiconductor structure (e.g., the semiconductor structures of FIGS. 1A-1) in various stages of processing, in accordance with an embodiment of the present disclosure. FIGS. 3 and 4A-4I will be discussed in unison. The cross-sectional views of FIGS. 4A-4I correspond to the cross-sectional view of FIGS. 1A and 1B.

Figure 4A:
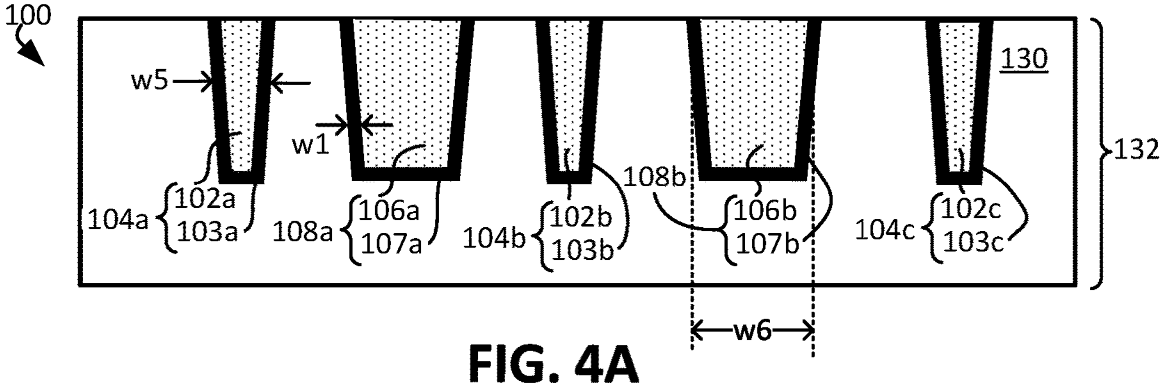
FIGS. 4A, 4B, 4C, 4D, 4E, 4F, 4G, 4H, and 4I collectively illustrate cross-sectional views of an example semiconductor structure in various stages of processing with respect to the methodology of FIG. 3, in accordance with an embodiment of the present disclosure.

Referring to FIG. 3, the method 300 includes, at 304, forming interconnect layer 132 comprising dielectric material 130 and interconnect features 104_a_, 108_a_, 104_b_, 108_b_, 104_c_ extending within the dielectric material 130, e.g., as illustrated in FIG. 4A. Various dimensions of the interconnect features of the interconnect layer 132 have been discussed herein above. The interconnect layer 132 may be formed using appropriate techniques for forming such interconnect layers.

Figure 4B:
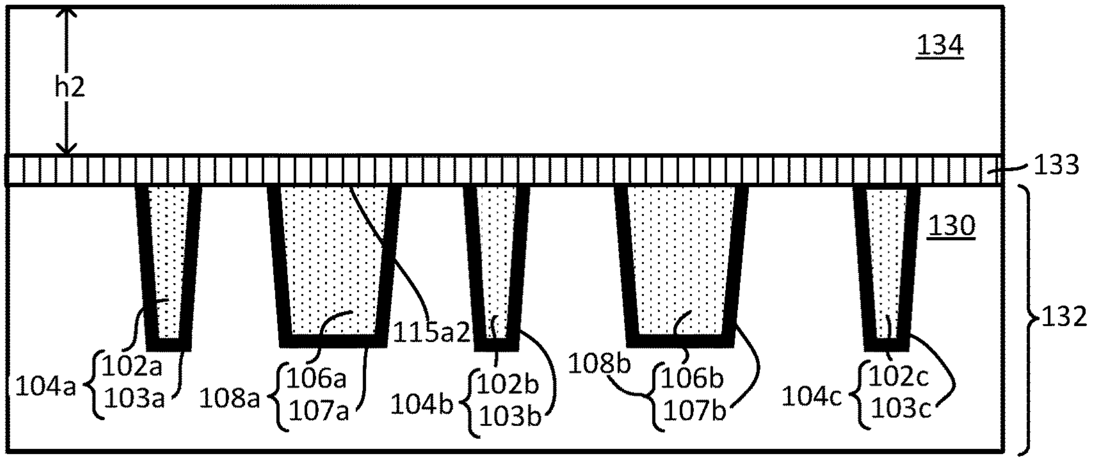
Figure 4C:
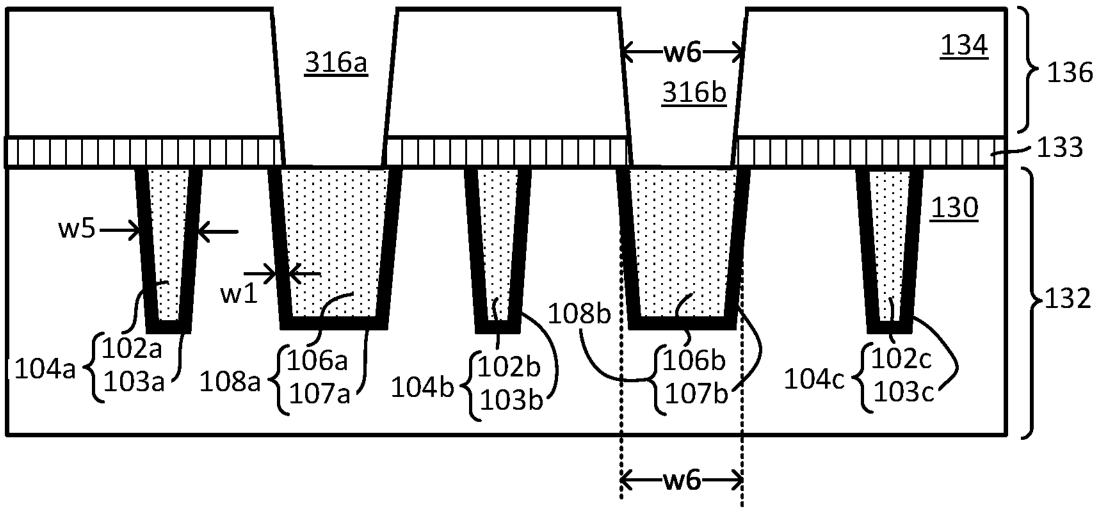

The method 300 then proceeds from 304 to 308, where the etch stop layer 133 and dielectric material 134 are deposited above the interconnect layer 132, e.g., as illustrated in FIG. 4B. In an example, the dielectric material 134 has a height of h2, which was discussed herein above with respect to FIGS. 1A and 1B. Also, at 308, recesses 316_a_, 316_b_ within the dielectric material 134 are formed, where the recesses 316_a_, 316_b_ are above the interconnect features 108_a_, 108_b_, respectively, e.g., as illustrated in FIG. 4C. The recesses 316_a_, 316_b_ are for forming the interconnect features 116_a_, 116_b_, respectively, and hence, the recesses are dimensioned accordingly. Any appropriate etching techniques may be employed to form the recesses 316_a_, 316_b_. In an example, the recesses 316_a_, 316_b_ may have an average width of w6, see FIG. 4C, where width w6 has been discussed herein above with respect to FIG. 1A.

Figure 4D:
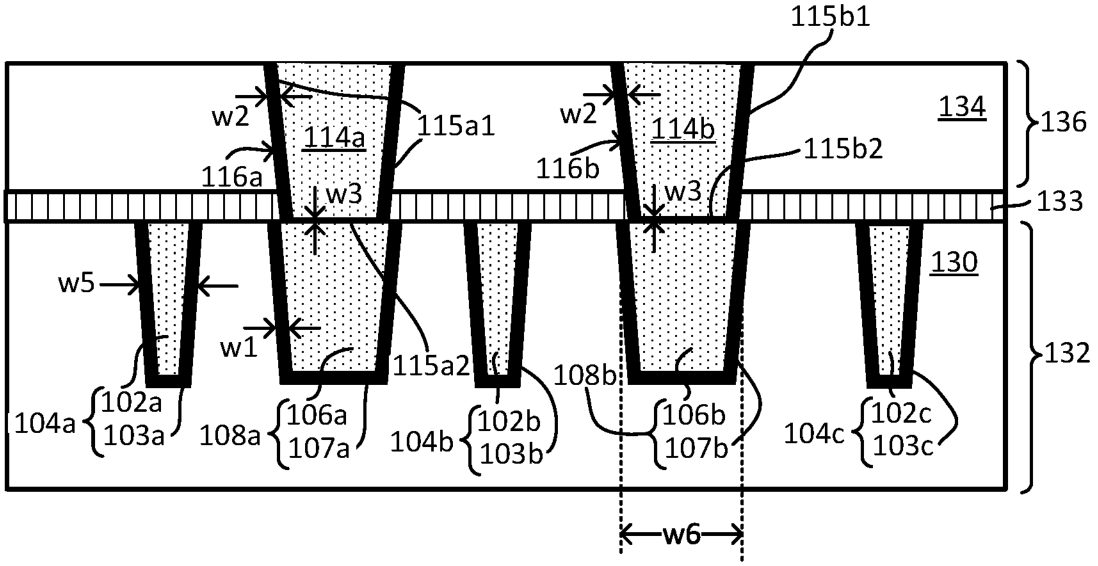
Figure 4E:
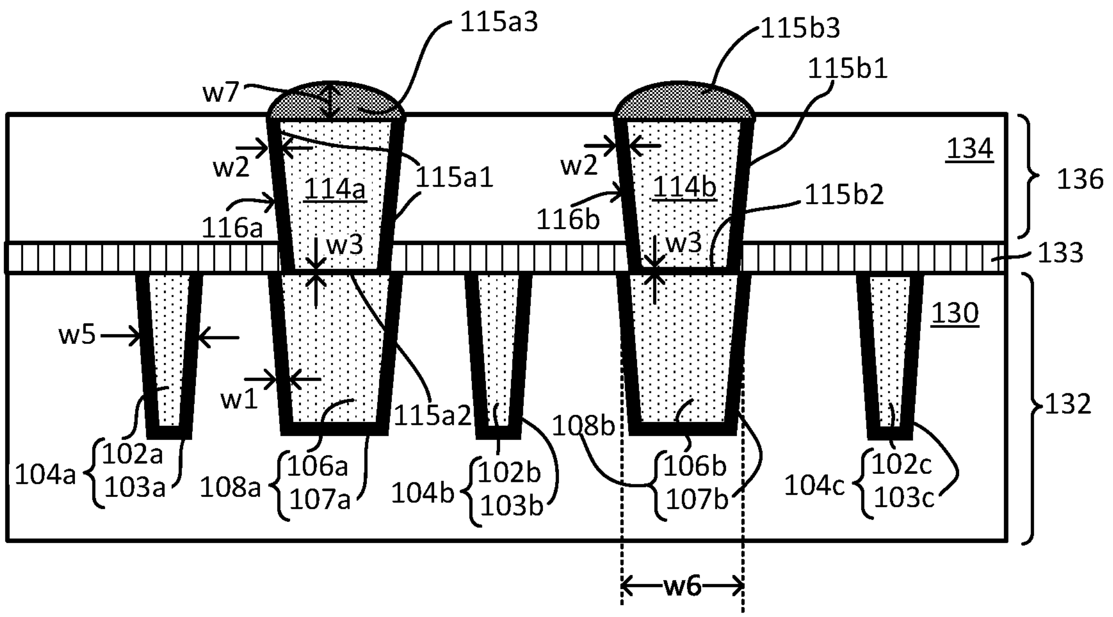

The method 300 then proceeds from 308 to 312, where interconnect features 116_a_, 116_b_ are formed within the recesses 316_a_, 316_b_, respectively, e.g., as illustrated in FIGS. 4D and 4E. For example, the sections 115_al_ and 115_a_2 of the barrier layer are deposited on side and bottom surfaces, respectively, of the recess 316_a_, conductive fill material 114_a_ is then deposited within the recess 316_a_, followed by formation of the capping layer 115_a_3, to thereby form the interconnect feature 116_a_. The interconnect feature 116_b_ may also be formed in a similar manner.

In an example, the sections 115_al_ and 115_a_2 are deposited on side and bottom surfaces, respectively, of the recess 316_a_ using any appropriate deposition technique, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example. In one example, a selective deposition technique is used, which deposits a relatively thicker section 115_al_ on sidewalls of the recess 316_a_ and relatively thinner section 115_a_2 on bottom surface of the recess 316_a_. Example thicknesses of these sections have been discussed herein previously with respect to FIG. 1A. In one example, the sections 115_al_ and 115_a_2 having the selective thicknesses are deposited using a selective ALD process, in which a section of the barrier layer on the bottom of the recess 316_a_ is thinner compared to other sections of the barrier layer on the side walls of the recess 316_a_. In an example, the barrier layer of the interconnect feature 116_b_ are also formed in a similar manner.

Subsequent to formation of the barrier layers, the conductive fill materials 114_a_ and 114_b_ are respectively deposited within the recesses 316_a_, 316_b_ using any appropriate deposition techniques, such as electroplating, CVD, PVD, ALD, VPE, MBE, or LPE, for example. After that, the capping layers 115_a_3 and 115_b_3 are respectively formed for the interconnect features 116_a_, 116_b_, as illustrated in FIG. 4E. As discussed with respect to FIG. 1A, the capping layers have a thickness (or vertical height) of w7. The relatively thicker w7 ensures, for example, that when recess 320_a_ (see FIG. 4G) is formed above the capping layer 115_a_3, the recess 320_a_ does not extend through the capping layer 115_a_3 and damage the conductive material 114_a_.

Figure 4F:
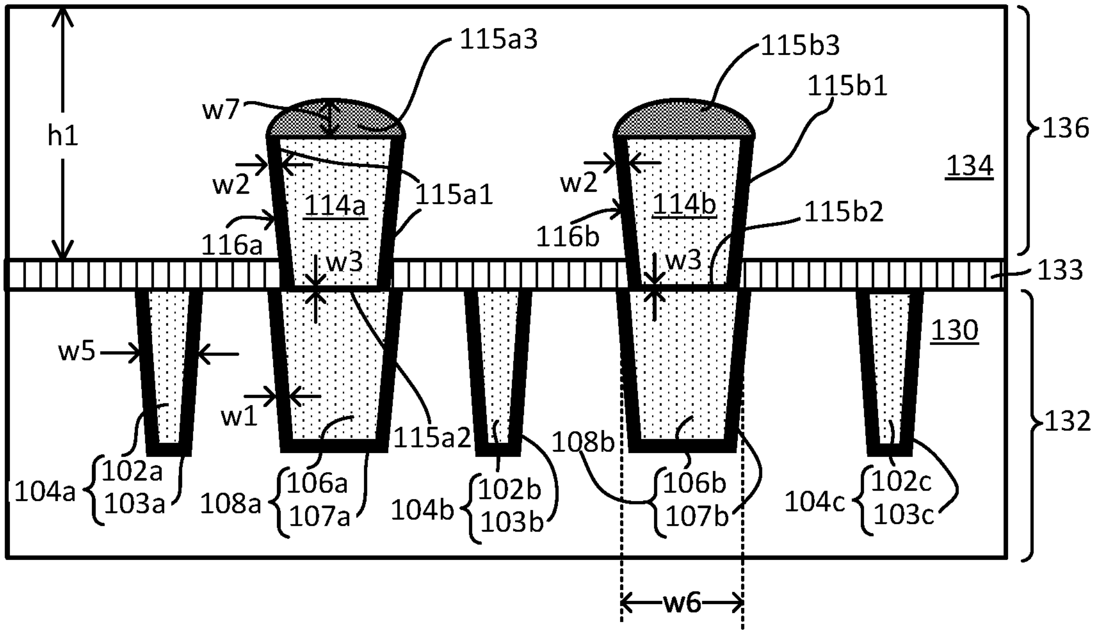

The method 300 then proceeds from 312 to 316, where additional dielectric material 134 is deposited above the previously deposited dielectric material 134, such that the height of the dielectric material 134 is now h1, e.g., as illustrated in FIG. 4F. The heights h1 and h2 have been discussed herein above with respect to FIGS. 1A and 1B. The additional dielectric material 134 is deposited using any appropriate deposition techniques, such as CVD, PVD, ALD, VPE, MBE, or LPE, for example.

Figure 4G:
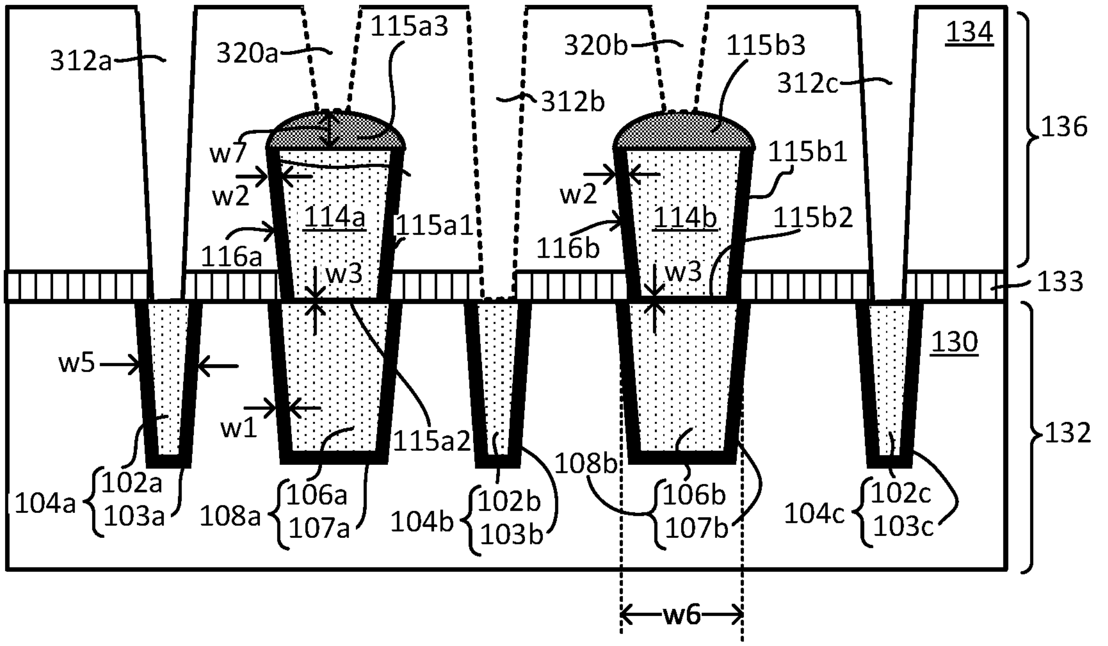

The method 300 then proceeds from 316 to 320, where recesses 312*a*, 320*a*, 312*b*, 320*b*, 312*c* are formed within the dielectric material 134 (see FIG. 4G), e.g., to subsequently form the interconnect features 112*a*, 120*a*, 112*b*, 120*b*, 112*c*, respectively. The recesses 312*a*, 320*a*, 312*b*, 320*b*, 312*c* are formed respectively above the interconnect features 104*a*, 108*a*, 104*b*, 108*b*, 104*c*, as illustrated in FIG. 4G. The recesses 320*a*, 312*b*, 320*b* are illustrated using dotted lines, e.g., because in one example these recesses are out of the plane on which the figures are drawn, and hence, may not be visible in the cross-sectional view of FIG. 4G (see discussion regarding out of plane, discussed with respect to FIG. 1B herein above).

Figure 4H:
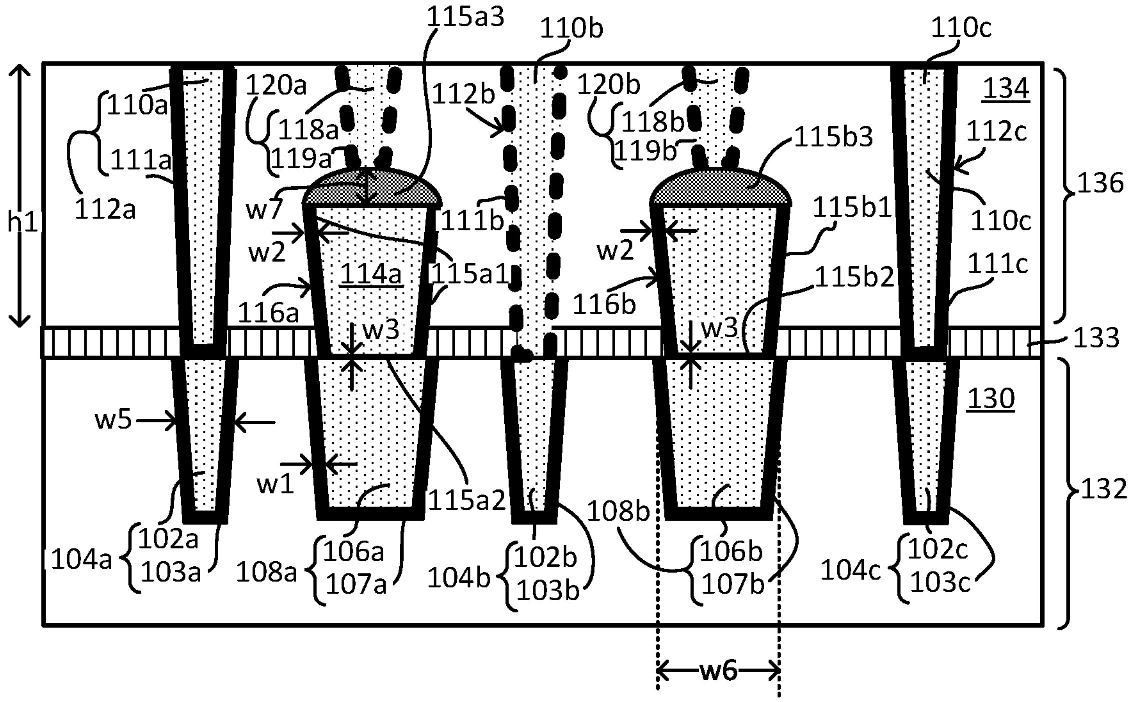

The method 300 then proceeds from 320 to 324, where interconnect features 112*a*, 120*a*, 112*b*, 120*b*, 112*c* are respectively formed within the recesses 312*a*, 320*a*, 312*b*, 320*b*, 312*c*, as illustrated in FIG. 4H. For example, formation of the interconnect features involves depositing corresponding barrier layers on sidewalls of the recesses, and then depositing the conductive material within the recesses. The barrier layers of the interconnect features 120*a*, 112*b*, 120*b* are illustrated using dotted lines, e.g., as these interconnect features may be out of plane and may not be visible in the cross-section of FIG. 4H, e.g., as also discussed herein above with respect to FIG. 1B.

Figure 4I:
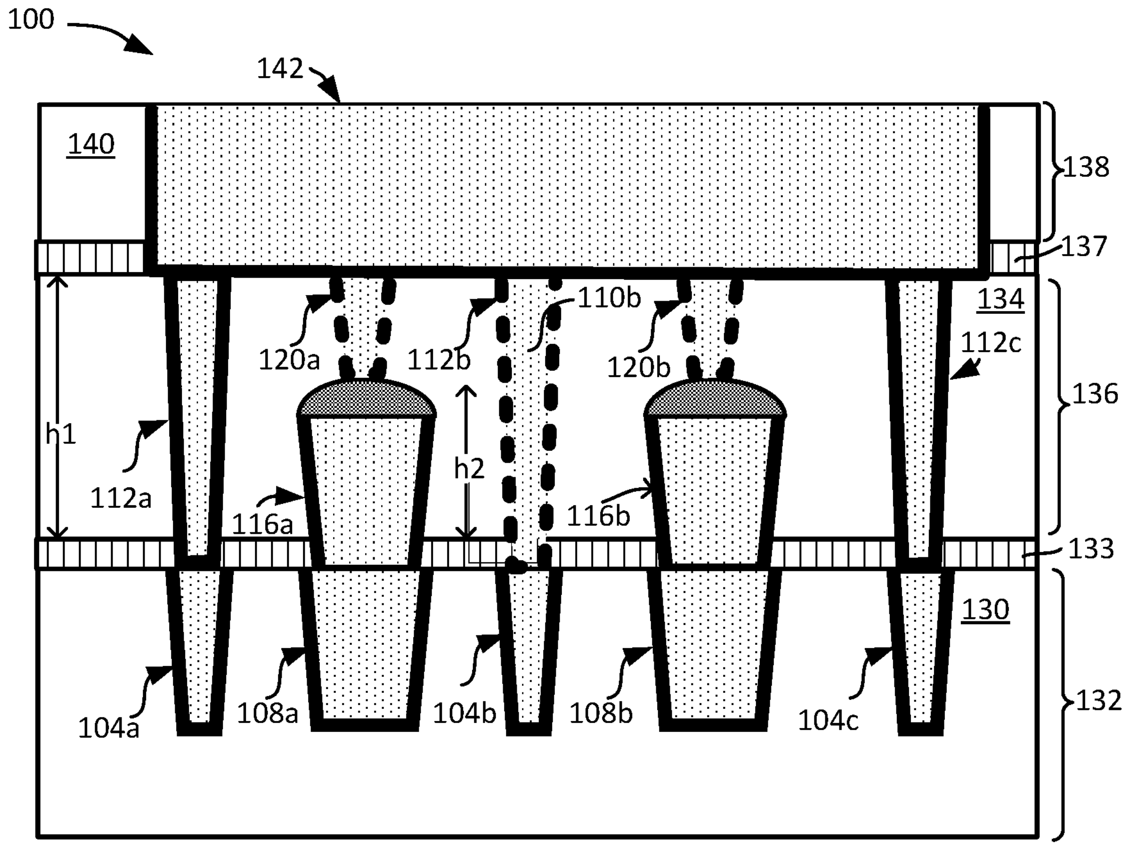

The method 300 then proceeds from 324 to 328, where etch stop layer 137 is formed above the interconnect layer 136, and the interconnect layer 138 (e.g., comprising the interconnect feature 142 and one or more other interconnect features not illustrated in FIG. 4I) is formed above the etch stop layer 137, e.g., as illustrated in FIG. 4I. The etch stop layer 137 and the interconnect layer 138 are formed using appropriate techniques for forming etch stop layers and interconnect layers. The resultant structure of FIG. 4I is same as the structure illustrated in FIG. 1B.

Note that the processes in method 300 are shown in a particular order for ease of description. However, one or more of the processes may be performed in a different order or may not be performed at all (and thus be optional), in accordance with some embodiments. Numerous variations on method 300 and the techniques described herein will be apparent in light of this disclosure.

Example System

Figure 5:
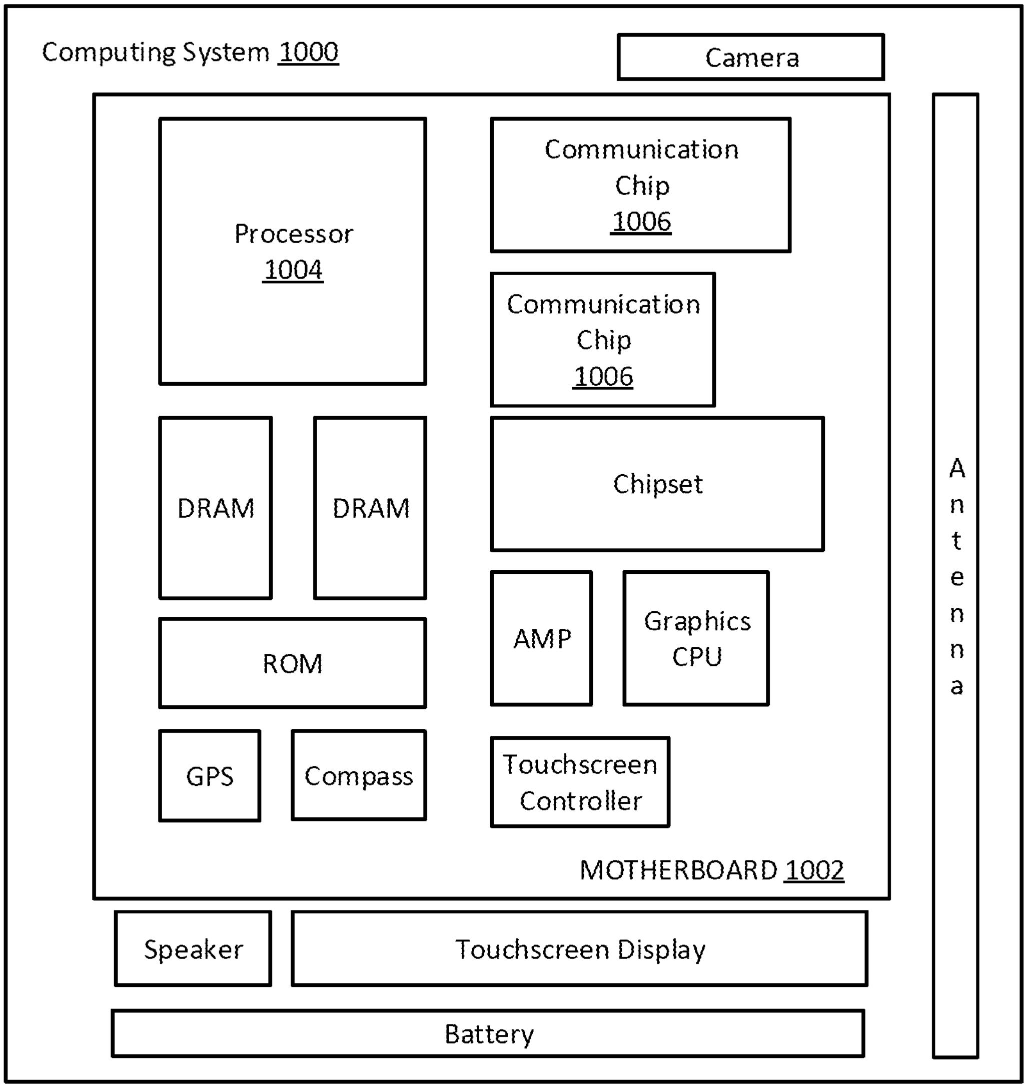
FIG. 5 illustrates a computing system implemented with integrated circuit structures formed using the techniques disclosed herein, in accordance with some embodiments of the present disclosure.

FIG. 5 illustrates a computing system 1000 implemented with integrated circuit structures formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1. An integrated circuit structure, comprising: a first interconnect layer including a first interconnect feature and a second interconnect feature; and a second interconnect layer above the first interconnect layer, the second interconnect layer including a third interconnect feature, a fourth interconnect feature, and a fifth interconnection feature, the third interconnect feature extending from an upper surface of the first interconnect feature to an upper surface of the second interconnect layer, the fourth interconnect feature extending from an upper surface of the second interconnect feature to below the upper surface of the second interconnect layer, and the fifth interconnect feature extending from an upper surface of the fourth interconnect feature to the upper surface of the second interconnect layer.

Example 2. The integrated circuit structure of example 1, wherein the fourth interconnect feature comprises (i) conductive fill material, (ii) a first section of a layer comprising conductive material on sidewalls of the conductive fill material, and (iii) a second section of the layer comprising conductive material on a bottom surface of the conductive fill material, wherein a thickness of the first section of the layer is at least 10% more than a thickness of the second section of the layer.

Example 3. The integrated circuit structure of any one of examples 1-2, wherein the fourth interconnect feature comprises (i) conductive fill material, (ii) a first section of a layer comprising conductive material on sidewalls of the conductive fill material, and (iii) a second section of the layer comprising conductive material on a bottom surface of the conductive fill material, wherein a thickness of the first section of the layer is at least 1 nanometer more than a thickness of the second section of the layer.

Example 4. The integrated circuit structure of any one of examples 2-3, wherein the second section of the layer is between (i) the conductive fill material of the fourth interconnect feature and (ii) the second interconnect feature.

Example 5. The integrated circuit structure of any one of examples 2-4, wherein the first section of the layer and the second section of the layer are elementally the same.

Example 6. The integrated circuit structure of any one of examples 2-5, wherein the layer is a barrier layer and comprises one or more of cobalt, nickel, ruthenium, molybdenum, manganese, titanium, tungsten, or tantalum, and wherein the conductive fill material comprises one or more of copper, ruthenium, molybdenum, tungsten, aluminum, tin, indium, antimony, or bismuth.

Example 7. The integrated circuit structure of any one of examples 2-6, wherein the layer is a first layer, and wherein the fourth interconnect feature further comprises a second layer comprising conductive material on an upper surface of the conductive fill material, the second layer at least in part between the conductive fill material and the fifth interconnect feature, and wherein the second layer has a thickness of at least 2 nanometers.

Example 8. The integrated circuit structure of example 7, wherein the second layer is a capping layer on the upper surface of the conductive fill material, and wherein the second layer comprises cobalt.

Example 9. The integrated circuit structure of any one of examples 1-8, wherein the first interconnect feature is coupled to a word line (WL) of a memory cell, and the second interconnect feature is coupled to a bit line (BL) of the memory cell.

Example 10. The integrated circuit structure of any one of examples 1-9, wherein a horizontal width of the second interconnect feature is at least 2 nanometers greater than a horizontal width of the first interconnect feature.

Example 11. The integrated circuit structure of any one of examples 1-10, wherein a vertical height of the third interconnect feature is within 1 nanometer of a sum of vertical heights of the fourth and fifth interconnect features.

Example 12. The integrated circuit structure of any one of examples 1-11, wherein a vertical height of the third interconnect feature is at least 5 nanometers more than a vertical height of the fourth interconnect feature.

Example 13. The integrated circuit structure of any one of examples 1-12, wherein at least a section of the upper surface of the first interconnect feature is within a first horizontal plane, wherein at least a section of the upper surface of the second interconnect feature is within a second horizontal plane, and wherein the first and second horizontal planes are vertically separated by at most 1 nm.

Example 14. The integrated circuit structure of any one of examples 1-13, wherein the upper surface of the fourth interconnect feature is at least 1 nm wider than a bottom surface of the fifth interconnect feature.

Example 15. The integrated circuit structure of any one of examples 1-14, further comprising: an etch stop layer between the first interconnect layer and the second interconnect layer.

Example 16. The integrated circuit structure of any one of examples 1-15, wherein the third interconnect feature extends through the etch stop layer and contacts the upper surface of the first interconnect features, and the fourth interconnect feature extends through the etch stop layer and contacts the upper surface of the second interconnect features.

Example 17. An integrated circuit structure, comprising: an upper etch stop layer and a lower etch stop layer, without any intervening etch stop layer between the upper and lower etch stop layers, each of the upper and lower etch stop layers comprising corresponding dielectric materials; a first interconnect feature extending from the lower etch stop layer to the upper etch stop layer; and a vertical stack of a second interconnect feature and a third interconnect feature extending from the lower etch stop layer to the upper etch stop layer, such that (i) the second interconnect feature extends from the lower etch stop layer, (ii) the third interconnect feature extends from the upper etch stop layer, and (iii) an upper surface of the second interconnect feature and a lower surface of the third interconnect feature makes contact at a plane between the upper and lower etch stop layers.

Example 18. The integrated circuit structure of example 17, wherein the first interconnect feature and the vertical stack are laterally separated by at most 400 nanometers.

Example 19. The integrated circuit structure of any one of examples 17-18, wherein the first interconnect feature is coupled to a word line (WL) of a memory cell, and the second interconnect feature is coupled to a bit line (BL) of the memory cell.

Example 20. The integrated circuit structure of any one of examples 17-19, wherein a horizontal width of the second interconnect feature is at least 2 nanometers greater than a horizontal width of the first interconnect feature.

Example 21. The integrated circuit structure of any one of examples 17-20, wherein a vertical height of the first interconnect feature is within 1 nanometer of a vertical height of the vertical stack of the second and third interconnect features.

Example 22. An integrated circuit structure, comprising: a vertical stack of a lower interconnect feature, an intermediate interconnect feature, and an upper interconnect feature, wherein a lower surface of the intermediate interconnect feature is on an upper surface of the lower interconnect feature, and a lower surface of the upper interconnect feature is on an upper surface of the intermediate interconnect feature, wherein the intermediate interconnect feature comprises (i) conductive fill material, (ii) a first section of a layer comprising conductive material on side surfaces of the conductive fill material, and (iii) a second section of the layer comprising conductive material on a bottom surface of the conductive fill material, and wherein a thickness of the first section of the layer is at least 0.75 nanometer more than a thickness of the second section of the layer.

Example 23. The integrated circuit structure of example 22, wherein the thickness of the first section of the layer is at least 1 nanometer more than the thickness of the second section of the layer.

Example 24. The integrated circuit structure of any one of examples 22-23, wherein the layer is a barrier layer and comprises one or more of cobalt, nickel, ruthenium, molybdenum, manganese, titanium, tungsten, or tantalum, and wherein the conductive fill material comprises one or more of copper, ruthenium, molybdenum, tungsten, aluminum, tin, indium, antimony, or bismuth.

Example 25. The integrated circuit structure of any one of examples 22-24, wherein the first section of the layer and the second section of the layer are elementally same.

Example 26. The integrated circuit structure of any one of examples 22-25, further comprising: an upper etch stop layer and a lower etch stop layer, without any intervening etch stop layer therebetween, wherein the intermediate interconnect feature and the upper interconnect feature extends at least in part between the upper and lower etch stop layers, wherein the lower interconnect feature is below the lower etch stop layer.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit structure, comprising:

a first interconnect layer including a first interconnect feature and a second interconnect feature; and a second interconnect layer above the first interconnect layer, the second interconnect layer including a third interconnect feature, a fourth interconnect feature, and a fifth interconnect feature, the third interconnect feature extending from an upper surface of the first interconnect feature to an upper surface of the second interconnect layer, the fourth interconnect feature extending from an upper surface of the second interconnect feature to below the upper surface of the second interconnect layer, and the fifth interconnect feature extending from an upper surface of the fourth interconnect feature to the upper surface of the second interconnect layer, wherein the fourth interconnect feature comprises a conductive fill material, a first layer comprising first conductive material on sidewalls and a bottom surface of the conductive fill material, and a second layer comprising second conductive material directly on an upper surface of the conductive fill material, the second layer at least in part between the conductive fill material and the fifth interconnect feature, wherein the first conductive material is different from the second conductive material.

2. The integrated circuit structure of claim 1, wherein a thickness of a first section of the first layer on the sidewalls of the conductive fill material is at least 10% more than a maximum thickness of a second section of the first layer on the bottom surface of the conductive fill material.

3. The integrated circuit structure of claim 1, wherein a thickness of a first section of the first layer on the sidewalls of the conductive fill material is at least 1 nanometer more than a maximum thickness of a second section of the first layer on the bottom surface of the conductive fill material.

4. The integrated circuit structure of claim 3, wherein the second section of the first layer is between (i) the conductive fill material of the fourth interconnect feature and (ii) the second interconnect feature.

5. The integrated circuit structure of claim 3, wherein the first section of the first layer and the second section of the first layer are elementally the same.

6. The integrated circuit structure of claim 3, wherein the first layer is a barrier layer and comprises one or more of cobalt, nickel, ruthenium, molybdenum, manganese, titanium, tungsten, or tantalum, and wherein the conductive fill material comprises one or more of copper, ruthenium, molybdenum, tungsten, aluminum, tin, indium, antimony, or bismuth.

7. The integrated circuit structure of claim 3, wherein the second layer has a thickness of at least 2 nanometers, and is thicker than a maximum thickness of the second section of the first layer on the bottom surface of the conductive fill material.

8. The integrated circuit structure of claim 7, wherein the second layer is a capping layer on the upper surface of the conductive fill material, and wherein the second layer comprises cobalt.

9. The integrated circuit structure of claim 1, wherein the first interconnect feature is coupled to a word line (WL) of a memory cell, and the second interconnect feature is coupled to a bit line (BL) of the memory cell.

10. The integrated circuit structure of claim 1, wherein a horizontal width of the second interconnect feature is at least 2 nanometers greater than a horizontal width of the first interconnect feature.

11. The integrated circuit structure of claim 1, wherein a vertical height of the third interconnect feature is within 1 nanometer of a sum of vertical heights of the fourth and fifth interconnect features.

12. The integrated circuit structure of claim 1, wherein at least a section of the upper surface of the first interconnect feature is within a first horizontal plane, wherein at least a section of the upper surface of the second interconnect feature is within a second horizontal plane, and wherein the first and second horizontal planes are vertically separated by at most 1 nm.

13. The integrated circuit structure of claim 1, wherein the upper surface of the fourth interconnect feature is at least 1 nm wider than a bottom surface of the fifth interconnect feature.

14. An integrated circuit structure, comprising:

an upper etch stop layer and a lower etch stop layer, without any intervening etch stop layer between the upper and lower etch stop layers, each of the upper and lower etch stop layers comprising corresponding dielectric materials;

a first interconnect feature extending through at least a portion of the lower etch stop layer to the upper etch stop layer; and a vertical stack of a second interconnect feature and a third interconnect feature extending through at least a portion of the lower etch stop layer to the upper etch stop layer, such that (i) the second interconnect feature extends above the lower etch stop layer, (ii) the third interconnect feature extends from the upper etch stop layer, and (iii) an upper surface of the second interconnect feature and a lower surface of the third interconnect feature makes contact at a plane between the upper and lower etch stop layers, wherein the second interconnect feature comprises a conductive fill material, a first layer comprising first conductive material on sidewalls and a bottom surface of the conductive fill material, and a second layer comprising second conductive material directly on an upper surface of the conductive fill material, the second layer at least in part between the conductive fill material and the third interconnect feature, wherein the first conductive material is different from the second conductive material.

15. The integrated circuit structure of claim 14, wherein the first interconnect feature and the vertical stack are laterally separated by at most 400 nanometers.

16. The integrated circuit structure of claim 14, wherein the first interconnect feature is coupled to a word line (WL) of a memory cell, and the second interconnect feature is coupled to a bit line (BL) of the memory cell.

17. The integrated circuit structure of claim 14, wherein a horizontal width of the second interconnect feature is at least 2 nanometers greater than a horizontal width of the first interconnect feature.

18. The integrated circuit structure of claim 14, wherein a vertical height of the first interconnect feature is within 1 nanometer of a vertical height of the vertical stack of the second and third interconnect features.

19. An integrated circuit structure, comprising:

a vertical stack of a lower interconnect feature, an intermediate interconnect feature, and an upper interconnect feature, wherein a lower surface of the intermediate interconnect feature is on an upper surface of the lower interconnect feature, and a lower surface of the upper interconnect feature is on an upper surface of the intermediate interconnect feature, wherein the intermediate interconnect feature comprises (i) conductive fill material, (ii) a first section of a first layer comprising first conductive material on side surfaces of the conductive fill material, (iii) a second section of the first layer comprising first conductive material on a bottom surface of the conductive fill material, and (iv) a second layer comprising second conductive material directly on an upper surface of the conductive fill material, wherein the first conductive material is different from the second conductive material, and wherein a thickness of the first section of the layer is at least 0.75 nanometer more than a thickness of the second section of the layer.

20. The integrated circuit structure of claim 19, wherein the layer is a barrier layer and comprises one or more of cobalt, nickel, ruthenium, molybdenum, manganese, titanium, tungsten, or tantalum, and wherein the conductive fill material comprises one or more of copper, ruthenium, molybdenum, tungsten, aluminum, tin, indium, antimony, or bismuth, and wherein the first section of the layer and the second section of the layer are elementally same, the integrated circuit structure further comprising:

an upper etch stop layer and a lower etch stop layer, without any intervening etch stop layer therebetween, wherein the intermediate interconnect feature and the upper interconnect feature extends at least in part between the upper and lower etch stop layers, wherein the lower interconnect feature is below the lower etch stop layer.

* * * * *